US011368035B2

(12) United States Patent
Marcos Pastor et al.

(10) Patent No.: US 11,368,035 B2
(45) Date of Patent: Jun. 21, 2022

(54) CONTROL PILOT WAKE-UP CIRCUIT FOR ON-BOARD CHARGER

(71) Applicant: Lear Corporation, Southfield, MI (US)

(72) Inventors: Adria Marcos Pastor, Valls (ES);
Alberto Martinez Ramirez, Valls (ES);
Antoni Amenos Murtra, Valls (ES);
Edgar Zahino Andres, Valls (ES)

(73) Assignee: LEAR CORPORATION, Southfield, MI (US)

( * ) Notice: Subject to any disclaimer, the term of this patent is extended or adjusted under 35 U.S.C. 154(b) by 239 days.

(21) Appl. No.: 16/832,501

(22) Filed: Mar. 27, 2020

(65) Prior Publication Data

US 2021/0305833 A1 Sep. 30, 2021

(51) Int. Cl.
*H02J 7/00* (2006.01)
*B60L 53/14* (2019.01)
*H03K 5/08* (2006.01)
*B60L 53/66* (2019.01)

(52) U.S. Cl.
CPC .......... *H02J 7/00711* (2020.01); *B60L 53/14* (2019.02); *B60L 53/66* (2019.02); *H02J 7/007182* (2020.01); *H03K 5/086* (2013.01)

(58) Field of Classification Search
USPC .................................................. 320/104, 109
See application file for complete search history.

(56) References Cited

U.S. PATENT DOCUMENTS

| 8,258,744 | B2 | 9/2012 | Ishii et al. |
| 8,618,767 | B2 | 12/2013 | Ishii et al. |
| 8,749,198 | B2 | 6/2014 | Klesyk |
| 9,333,864 | B2 | 5/2016 | Acena et al. |
| 9,372,216 | B2 | 6/2016 | Kanayama |
| 9,573,476 | B2 | 2/2017 | Timpf, Jr. et al. |
| 10,000,136 | B2 | 6/2018 | Jang et al. |
| 10,611,255 | B2 | 4/2020 | Shin et al. |
| 2012/0139337 | A1* | 6/2012 | Kim ........................ B60L 50/64 307/9.1 |
| 2013/0119931 | A1* | 5/2013 | Klesyk ...................... B60L 1/00 320/109 |
| 2013/0120889 | A1* | 5/2013 | Klesyk .................. B60L 3/0069 361/87 |

(Continued)

OTHER PUBLICATIONS

"SAE J1772", Retrieved online from https://en.wikipedia.org/wiki/SAE_J1772 on Apr. 17, 2019.

*Primary Examiner* — Samuel Berhanu

(74) *Attorney, Agent, or Firm* — Brooks Kushman P.C.

(57) ABSTRACT

An on-board charger (OBC) for an electric vehicle includes a charge unit, a controller, and a control pilot (CP) wake-up circuit. The charge unit is operable for receiving energy from an EVSE for charging a traction battery of the vehicle. The controller while awake can control the charge unit to charge the battery with energy from the EVSE. The CP wake-up circuit receives a control pilot (CP) signal from the EVSE, detects for a change in a current state of the CP signal while the controller is asleep, and generates a wake-up signal for waking up the controller in response to the current state of the CP signal changing to a new state. The CP wake-up circuit includes first/second detector circuits usable for detecting for a change in the current state of the CP signal to a first/second new state.

12 Claims, 8 Drawing Sheets

(56) References Cited

U.S. PATENT DOCUMENTS

| | | | |
|---|---|---|---|
| 2013/0320922 A1* | 12/2013 | Acena | B60L 53/66 |
| | | | 320/109 |
| 2015/0352967 A1* | 12/2015 | Timpf, Jr. | B60L 53/14 |
| | | | 320/109 |
| 2016/0272076 A1* | 9/2016 | Fan | B60L 53/14 |

* cited by examiner

CONTROL PILOT WAKE-UP CIRCUIT FOR ON-BOARD CHARGER

TECHNICAL FIELD

The present invention relates to a control pilot wake-up circuit for waking up an on-board charger (OBC) of an electric vehicle.

BACKGROUND

An on-board charger (OBC) of an electric vehicle is used for charging a traction battery of the vehicle. In one variation, the OBC converts electrical power received from an electric vehicle supply equipment (EVSE) connected to the grid into DC electrical power and charges the battery with the DC electrical power. In another variation, the OBC enables the battery to be charged directly with DC electrical power received from an EVSE.

SUMMARY

An on-board charger (OBC) for an electric vehicle includes a charge unit, a controller, and a control-pilot wake-up circuit. The charge unit is operable to receive energy from an electric vehicle supply equipment (EVSE) for charging a traction battery of the electric vehicle. The controller is operable to be in a sleep mode or in an awake mode. The controller in the awake mode is configured to control the charge unit to charge the traction battery with energy from the EVSE. The control pilot wake-up circuit is configured to receive a control pilot signal from the EVSE, detect for a change in a current state of the control pilot signal while the controller is in the sleep mode, and generate a wake-up signal for waking up the controller in response to the current state of the control pilot signal changing to a new state. The charge unit may include at least one of (i) a power plant operable for converting energy received from the EVSE into a usable form for charging the traction battery and (ii) a relay operable for transferring energy received from the EVSE directly to the traction battery.

In one or more embodiments, the control pilot wake-up circuit includes a first control pilot state change detector circuit usable for detecting for a change in the current state of the control pilot signal to a first new state and a second control pilot state change detector circuit usable for detecting for a change in the current state of the control pilot signal to a second new state. The first and second control pilot state change detector circuits have a same kind of electronic components. The control pilot wake-up circuit further includes a contact monitoring circuit common to the first and second control pilot state change detector circuits.

The electronic components of the first control pilot state change detector circuit include a first capacitor. The contact monitoring circuit is operable to periodically inject a current pulse to the first capacitor for charging the first capacitor. The electronic components of the first control pilot state change detector circuit are arranged such that the first capacitor discharges after receiving the current pulse while the current state of the control pilot signal remains unchanged and charges to have a voltage greater than a threshold upon receiving one or more of the current pulses after the current state of the control pilot signal has changed from the current state to the first new state. The contact monitoring circuit is further operable to generate the wake-up signal for waking up the controller in response to the voltage of the first capacitor becoming greater than the threshold due to the current state of the control pilot signal changing to the first new state.

The electronic components of the second control pilot state change detector circuit include a second capacitor. The contact monitoring circuit is operable to periodically inject a current pulse to the second capacitor for charging the second capacitor. The electronic components of the second control pilot state change detector circuit are arranged such that the second capacitor discharges after receiving the current pulse while the current state of the control pilot signal remains unchanged and charges to have a voltage greater than the threshold upon receiving one or more of the current pulses after the current state of the control pilot signal has changed from the current state to the second new state. The contact monitoring circuit is further operable to generate the wake-up signal for waking up the controller in response to the voltage of the second capacitor becoming greater than the threshold due to the current state of the control pilot signal changing to the second new state.

The first and second control pilot state change detector circuits are both usable for detecting for a change in the current state of the control pilot signal to a third new state.

In one or more embodiments, states of the control pilot signal include a state A in which a voltage of the control pilot signal is zero volts, a state B1 in which the voltage of the control pilot signal is a constant, positive, non-zero value of volts, and a state B2 in which the voltage of the control pilot signal is an alternating, non-zero value of volts. When the current state of the control pilot signal is either the state B1 or the state B2, the first control pilot state change detector circuit is used for detecting for a change in state of the control pilot signal from either the state B1 to the state B2 or the state B2 to the state B 1. When the current state of the control pilot signal is either the state A or the state B2, the second control pilot state change detector circuit is used for detecting for a change in state of the control pilot signal from either the state A to the state B2 or the state B2 to the state A. When the current state of the control pilot signal is either the state A or the state B1, either of the first control pilot state change detector circuit or the second control pilot state change detector circuit is used for detecting for a change in state of the control pilot signal from either the state A to the state B1 or the state B1 to the state A.

In one or more embodiments, states of the control pilot signal include a state A indicative of a cordset of the EVSE being disconnected from the on-board charger, a state B1 indicative of the cordset of the EVSE being connected to the on-board charger but the EVSE not being ready to charge, and a state B2 indicative of the cordset of the EVSE being connected to the on-board charger and the EVSE being ready to charge. When the current state of the control pilot signal is the state A, the second control pilot state change detector circuit is used for detecting for a change in state of the control pilot signal from the state A to the state B2 whereby the controller is woken up upon the cordset of the EVSE being connected to the on-board charger with the EVSE being ready to charge.

When the current state of the control pilot signal is the state A, either of the first control pilot state change detector circuit or the second control pilot state change detector circuit is used for detecting for a change in state of the control pilot signal from the state A to the state B1 whereby the controller is woken up upon the cordset of the EVSE being connected to the on-board charger with the EVSE not being ready to charge.

When the current state of the control pilot signal is the state B1, the first control pilot state change detector circuit is used for detecting for a change in state of the control pilot signal from the state B1 to the state B2 whereby the controller is woken up while the cordset of the EVSE is connected to the on-board charger upon the EVSE being ready to charge.

When the current state of the control pilot signal is the state B2, the first control pilot state change detector circuit is used for detecting for a change in state of the control pilot signal from the state B2 to the state B1 whereby the controller is woken up while the cordset of the EVSE is connected to the on-board charger upon the EVSE not being ready to charge.

When the current state of the control pilot signal is the state B2, the second control pilot state change detector circuit is used for detecting for a change in state of the control pilot signal from the state B2 to the state A whereby the controller is woken up upon the cordset of the EVSE being disconnected from the on-board charger.

When the current state of the control pilot signal is the state B 1, either of the first control pilot state change detector circuit or the second control pilot state change detector circuit is used for detecting for a change in state of the control pilot signal from the state B1 to the state A whereby the controller is woken up upon the cordset of the EVSE being disconnected from the on-board charger.

An electric vehicle having a traction battery and the OBC is also provided.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
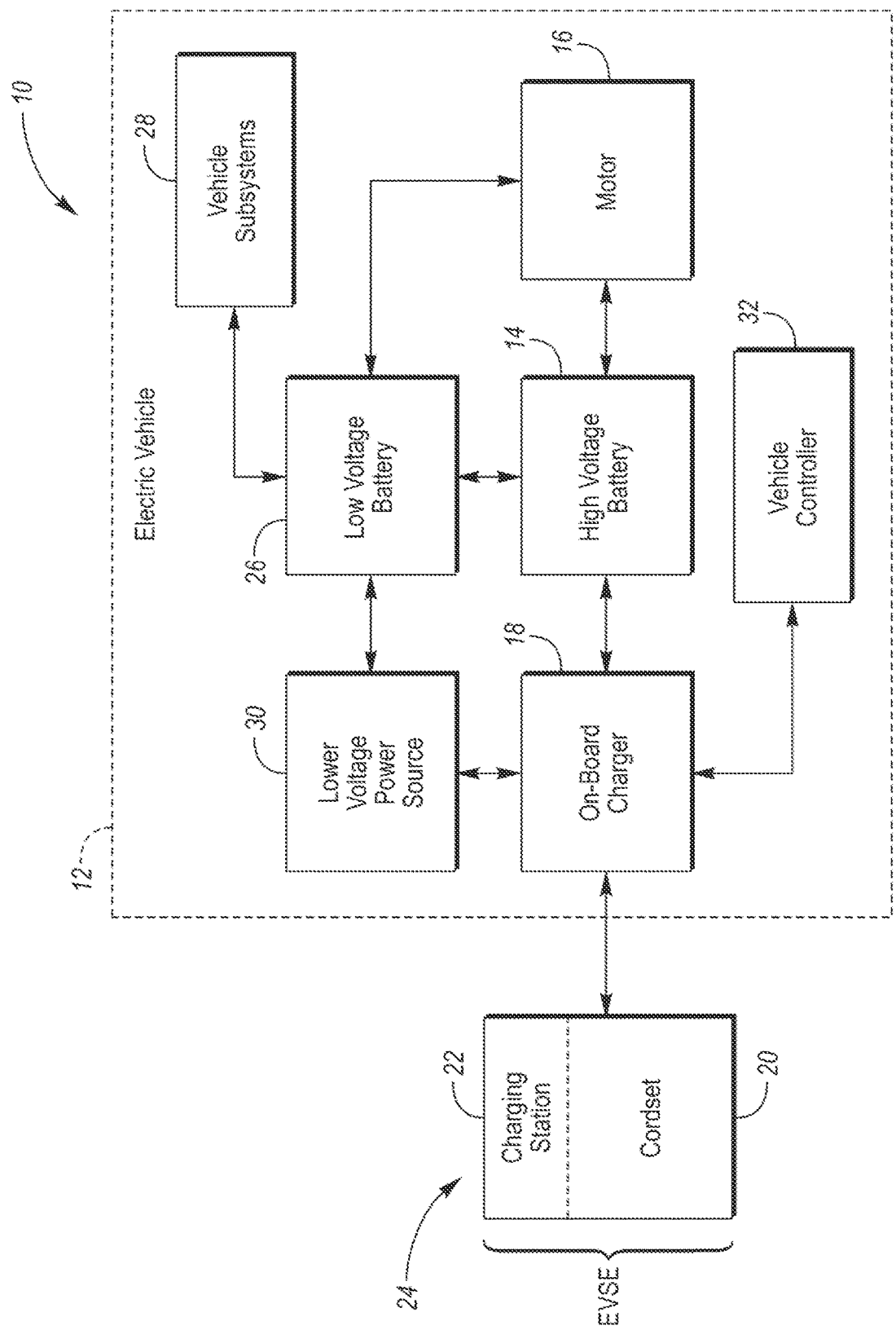
FIG. 1 illustrates a functional block diagram of a power system of an electric vehicle, the power system including an on-board charger (OBC)

Referring now to FIG. 1, a functional block diagram of a power system 10 of an electric vehicle (EV) 12 in accordance with one or more embodiments is shown. Power system 10 includes an on-board charger (OBC) 18. OBC 18 is "on-board" electric vehicle 12. The phrases "electric vehicle" and "EV" herein encompass any type of vehicle which uses electrical power for vehicle propulsion and encompass battery-only electric vehicles (BEV), hybrid electric vehicles (HEV), plug-in hybrid electric vehicles (PHEV), and the like. OBC 18 is used for charging a high voltage (HV) DC traction battery 14 of EV 12. Traction battery 14 is to be charged to be operable to provide electric current for use by an electric motor 16 to propel EV 12.

OBC 18 charges traction battery 14 using electrical power from a charging station 22. OBC 18 connects to charging station 22 via a cordset 20. Cordset 20 includes a cable having a terminal at one end adapted for receipt within a charge port of EV 12. OBC 18 is in electrical communication with the charge port of EV 12. In operation, OBC 18 takes (i.e., drains) electrical power from charging station 22 through cordset 20 and uses this electrical power to charge traction battery 14. Cordset 20, charging station 22, and any additional elements installed for OBC 18 to receive energy from an electrical utility power grid to which charging station 22 is connected may be collectively referred to herein as electric vehicle supply equipment (EVSE) 24.

In an "AC-to-DC charging" variation, OBC 18 charges traction battery 14 using electrical power received from the grid through charging station 22. In operation, OBC 18 takes electrical power from charging station 22 through cordset 20, converts the electrical power into DC electrical power, and charges traction battery 14 with the DC electrical power.

Alternatively, in a "DC charging" variation such as "fast DC charging" or "DC fast charging", OBC 18 charges traction battery 14 using DC electrical power received from charging station 22. In operation, OBC 18 transfers DC electrical power from charging station 22 directly to traction battery 14 for the traction battery to be charged with the DC electrical power.

OBC 18 may include electronics or other elements operable to control and manage current flow used to support charging related operations for traction battery 14, and optionally, to support charging or otherwise powering a low voltage (LV) battery 26, one or more vehicle subsystems 28, and/or other electronically operable elements included within EV 12. LV battery 26 may be included to support powering vehicle subsystems 28 that operate at voltages lower than electric motor 16, such as remote keyless entry systems, heating and cooling systems, infotainment systems, braking systems, etc.

In addition to being charged with power provided through cordset 20, traction battery 14, LV battery 26, and vehicle subsystems 28 may be operable to power each other and/or to be powered with energy generated by electric motor 16. LV battery 26, for example, may be operable to provide current sufficient for use by a lower voltage power source 30. Lower voltage power source 30 may be operable to regulate current from LV voltage battery 26 for use with OBC 18 and one or more of vehicle subsystems 28.

For exemplary purposes, the terms "lower," "low", and "high" are used to differentiate voltage levels respectively coinciding with approximately 5 VDC, 12 VDC, and 200 VDC, which are commonly used within vehicles to support the operation associated with each of the corresponding energy sources. This is done without intending to unnecessarily limit the scope of the present invention as the present invention fully contemplates energy sources having the same or different voltage levels and/or current production/generation capabilities. For instance, the "low" voltage level per international regulations refers to those not-risky voltages (lower than 50 VAC and 75 VDC) and the "high" voltage level in most European regions typically coincides with approximately 400 VDC.

Lower voltage power source 30 may be operable to set a voltage used by OBC 18 to test for connection of cordset 20, generate a wake-up signal, or the like. Lower voltage power source 30, for example, may be a voltage or current regulator having capabilities sufficient to compensate for voltage variation of traction battery 14 and/or LV battery 26 to provide steady current to OBC 18 and/or other elements electrically connected thereto, which may be sensitive to voltage variations. In this manner, although depicted as a separate element in the functional block diagram illustrated in FIG. 1, lower voltage power source 30 may be contained within OBC 18 as an electrical element thereof.

Power system 10 further includes a vehicle controller 32. Vehicle controller 32 is an electronic device such as a processor, micro-controller, or the like (e.g., a computer). Vehicle controller 32 facilitates executing logical operations and undertaking other processing requirements associated with EV 12. Vehicle controller 32 is in communication with OBC 18 and is operable to communicate and control other nodes of EV 12 including nodes involved in the charging applications. Optionally, one or more of the elements of power system 10 may include their own controller or processor.

Figure 2:
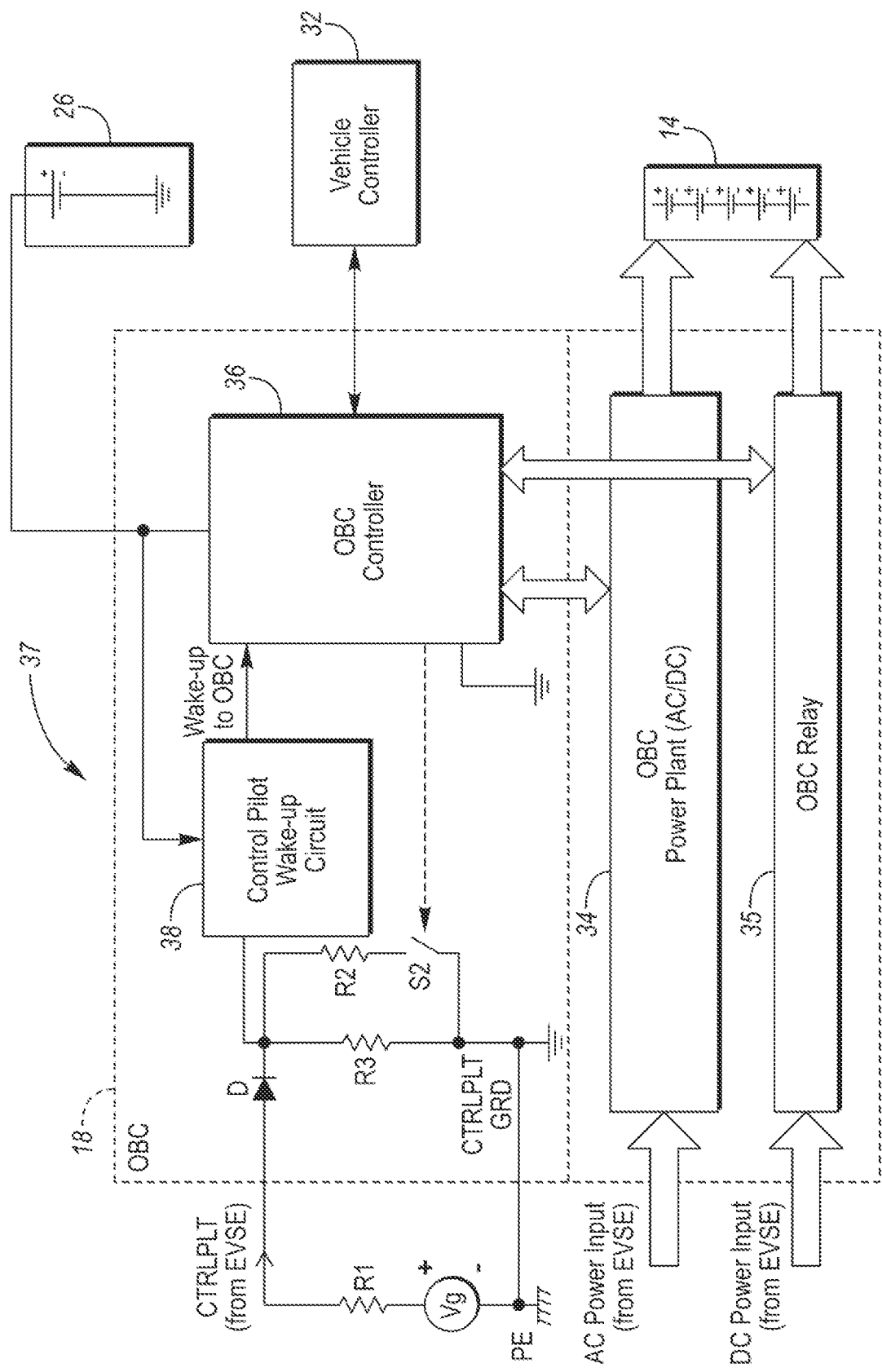
FIG. 2 illustrates a block diagram of the OBC, the OBC including a control pilot (CP) wake-up circuit for receiving a control pilot (CP) signal from an EVSE and for waking up an OBC controller of the OBC in response to a state change of the CP signal.

Referring now to FIG. 2, with continual reference to FIG. 1, a block diagram of OBC 18 in accordance with one or more embodiments is shown.

For "AC-to-DC charging", OBC 18 includes a charge unit such as in the form of an OBC power plant 34 operable for converting electrical power received from the grid, via EVSE 24, to DC electrical power required to charge traction battery 14. Accordingly, OBC power plant 34 may include an AC-to-DC power converter and other associated power electronics operable to convert energy taken from the electrical grid into a usable form for charging traction battery 14. For instance, OBC power plant 34 may include power electronics to correct the power factor to meet regulatory standards or provide DC-to-DC power conversion for matching charging profiles of fraction battery 14.

For "DC charging", a charge unit such as in the form of an OBC relay 35 is provided. OBC relay 35 may be a part of OBC 18 or may be a separate component from OBC 18. OBC relay 35 is controllable to be in an opened position or a closed position. When OBC relay 35 is closed, DC electrical power from charging station 22 may be taken by OBC 18 and transferred directly over the OBC relay to traction battery 14. When OBC relay 35 is opened, electrical power cannot be transferred over the OBC relay to traction battery 14.

OBC 18 includes an OBC controller 36. OBC controller 36 is an electronic device such as a processor, micro-controller, or the like (e.g., a computer). OBC controller 36 is operable to handle control algorithms for the OBC functions described above. OBC controller 36 may detect the connection of cordset 20 to the charging port of EV 12, identify the charging cable and/or plug, and control and monitor switching devices or other electronics associated with OBC 18. OBC controller 36 may communicate with vehicle controller 32 to convey charging status and other information corresponding to the operation of OBC 18.

OBC controller 36 is operable to be in a sleep mode or in an awake mode. OBC controller 36 in the awake mode is configured to control the charge unit (i.e., OBC power plant 34 and/or OBC relay 35) to charge traction battery 14 with energy from EVSE 24. Otherwise, when OBC controller 36 is in the sleep mode, the charge unit is disabled from charging traction battery 14 with energy from EVSE 24.

For "AC-to-DC charging", OBC controller 36 controls OBC power plant 34 in converting electrical power from charging station 22 into DC electrical power and charging traction battery 14 with the DC electrical power. For example, OBC controller 36 appropriately controls switching and switching duration of power transistor switches (not shown) of OBC power plant 34 used for converting electrical power into a selected amount of DC electrical power.

For "DC charging", depending on the EV architecture, OBC controller 36 either directly controls OBC relay 35 to be closed or communicates to a controller of OBC relay 35 to close OBC relay 35 when DC electrical power from charging station 22 is to be transferred directly to traction battery 14. At all other times, OBC relay 35 is in opened. Thus, OBC relay 35 has to be controlled by OBC controller 36 to be closed.

Although depicted as an integrated controller, OBC controller 36 may be provided as a separate component electrically connected to OBC 18. OBC power plant 34 and/or OBC relay 35, OBC controller 36, and associated control electronics, whether integrated with OBC 18 or not, may form an on-board battery charging system 37.

In addition to providing electrical power from the electrical power grid, EVSE 24 generates a control pilot (CTRLPLT) signal ("CP signal"). The CP signal may be read and acknowledged by OBC 18. The CP signal has a defined signal format according to industry standards and provides OBC 18 with the necessary information for proper AC to DC charging modes. The CP signal conveys information to OBC controller 36 for use in launching and monitoring the charging process of traction battery 14.

Among its main functions, the CP signal can be used to check the continuity of the vehicle chassis connection to the power earth of EVSE 24. If this signal is not present at the OBC input, then the charging process may not be allowed. The CP signal may include a command from EVSE 24 to OBC 18 indicating the maximum current that the OBC can draw from the electrical grid to charge traction battery 14. This command may be embedded in the duty cycle of the CP signal, which can be converted into available amps from the electrical grid according to predefined criteria, such as certain formulae defined in the relevant regulatory standards. To this end, the CP signal is generated using pulse width modulation (PWM). The CP signal may also provide an answer from EV 12 to EVSE 24 informing the EVSE that the EV is ready to accept charge. Thereafter, the charging process may commence.

For instance, according to relevant regulatory standards, the CP signal has the following main features:
Supply voltage range: Vg=±12 V±0.6 V (tolerance);
Duty cycle (D): 0%≤D≤100%; and
Frequency (fCP) when 0%<D<100%: 1 kHz nominal ±3% (tolerance).

Per these main features, the CP signal has the following status definitions:
State B1: Vg=12V, D=100%→cordset 20 is connected (i.e., plugged) to EV 12 but EVSE 24 is not ready to transfer electrical power from charging station 22 to the EV;
State B2: Vg=±12V, 5%≤D≤95%±0.5% (tolerance) →cordset 20 is connected to EV 12 and EVSE 24 is ready to transfer electrical power from charging station 22 to the EV; and
State A or E/F—none of these states allow electrical power to be transferred from charging station. For example, state A: the CP signal is 0V→cordset 20 is not connected to EV 12.

The electric vehicle level effect of the different CP states are as follows:
State A: Cordset 20 is not connected to EV 12. For example, EV 12 has been parked in the vehicle user's private parking, but the EV does not need to be recharged. OBC 18 enters the sleep mode under state A after preliminary conditions have been fulfilled.

State B1: Cordset 20 is connected to EV 12, but EVSE 24 is not ready to charge. For example, the vehicle user arrives with EV 12 to charging station 22 and plugs cordset 20 into the charge port of the EV. However, EVSE 24 is not able to deliver electrical power from charging station 22 to EV 12 due to overload. OBC 18 enters sleep mode under state B1 after preliminary conditions have been fulfilled.

State B2: Cordset 20 is connected to EV 12 and EVSE 24 is ready to charge. For example, the charging cycle has finished but cordset 20 is still plugged into the charge port of EV 12. OBC 18 enters the sleep mode after preliminary conditions have been fulfilled. OBC 18 wakes-up from the sleep mode when cordset 20 is unplugged from EV 12 as the CP signal will not be present any longer.

As shown in FIG. 2, OBC 12 further includes a control pilot (CP) wake-up circuit 38 for waking up OBC 18. More particularly, CP wake-up circuit 38 is for waking up OBC controller 36 when the OBC controller is in the sleep mode (i.e., a low quiescent current mode).

For "AC-to-DC charging", while OBC controller 36 is asleep, OBC 18 cannot receive and convert electrical power from charging station 22 into DC electrical power for charging traction battery 14 as the OBC controller must be awake to control the operation of OBC power plant 34. Thus, OBC 18 is effectively asleep while OBC controller 36 is asleep. Conversely, while OBC controller 36 is awake, OBC 18 can receive and convert electrical power from charging station 22 into DC electrical power for charging traction battery 14 as the OBC controller is awake to control the operation of OBC power plant 34. Thus, OBC 18 is effectively awake while OBC controller 36 is awake.

For "DC charging", while OBC controller 36 is asleep, DC electrical power cannot be transferred from charging station 22 to traction battery 14 as the OBC controller must be awake to either directly control the operation of OBC relay 35 or communicate with a controller of OBC relay 35 to indirectly control the operation of OBC relay 35. Thus, OBC 18 is effectively asleep while OBC controller 36 is asleep. Conversely, while OBC controller 36 is awake, DC electrical power can be transferred from charging station 22 to traction battery 14 as the OBC controller is awake to directly or indirectly control the operation of OBC relay 35. Thus, OBC 18 is effectively awake while OBC controller 36 is awake.

In operation, CP wake-up circuit 38 receives the CP signal from EVSE 24. In accordance with one or more embodiments, CP wake-up circuit 38 processes the CP signal to detect a state change of the CP signal. CP wake-up circuit 38 generates a wake-up signal in response to detecting a state change of the CP signal. CP wake-up circuit 38 provides the generated wake-up signal to OBC controller 36 to wake up the OBC controller and cause the OBC controller to exit the sleep mode.

The provisioning of CP wake-up circuit 38 and its functioning is intended to not only meet desired wake-up capabilities but also other requirements that are affected by the wake-up requirements. Specific wake-up requirements include waking up OBC controller 36 when the state of the CP signal changes and performing the waking up relatively fast, e.g., less than 0.2 seconds. Affected requirements include a relatively low quiescent current, e.g., less than 200 µA.

Figure 3:
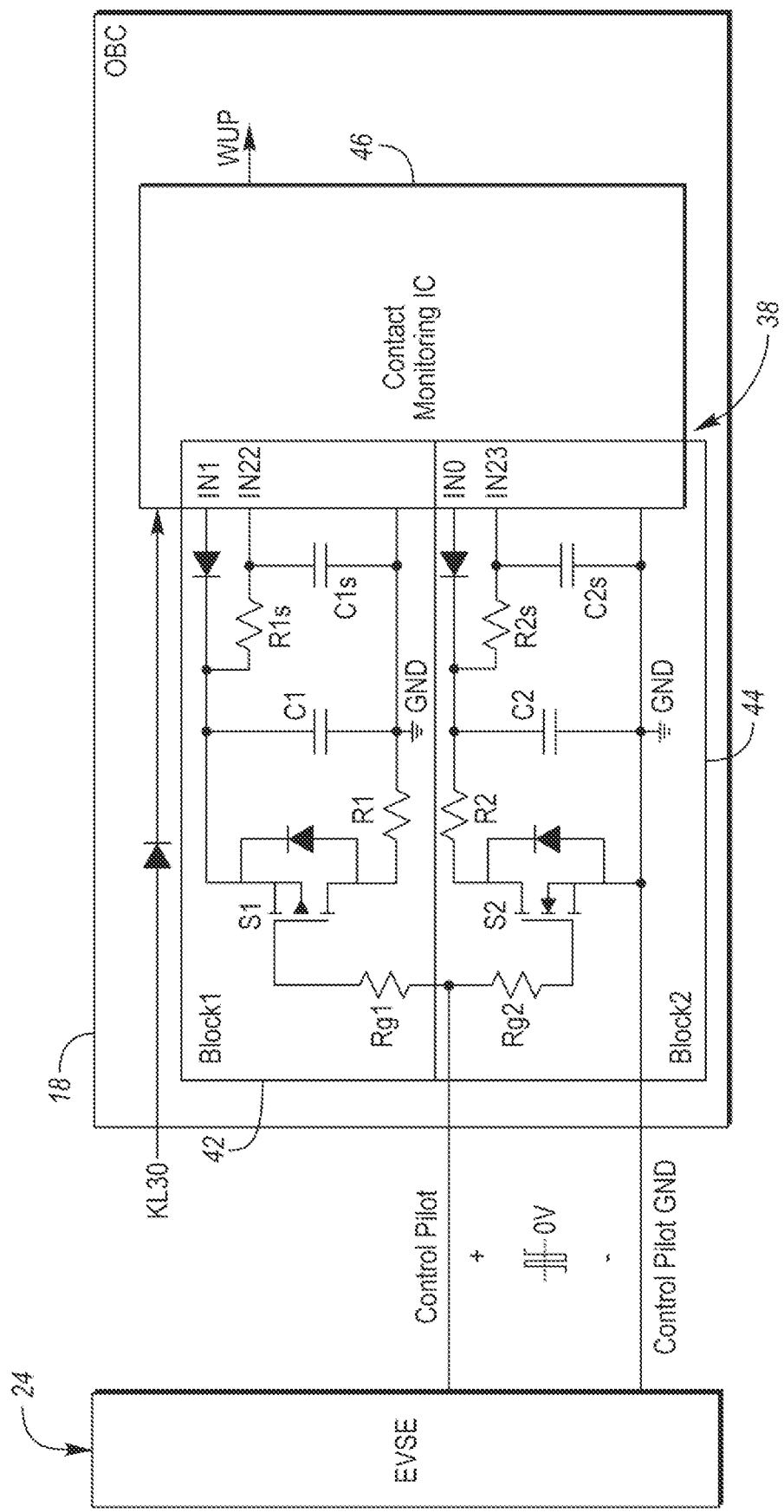
FIG. 3 illustrates a schematic circuit diagram of the CP wake-up circuit, the CP wake-up circuit including a first CP state change detector circuit, a second CP state change detector circuit, and a contact monitoring integrated circuit (IC)

Referring now to FIG. 3, with continual reference to FIGS. 1 and 2, a schematic circuit diagram of CP wake-up circuit 38 is shown. CP wake-up circuit includes a first CP state change detector circuit 42 (labeled "Block 1" in FIG. 3), a second CP state change detector circuit 44 (labeled "Block 2" in FIG. 3), and a contact monitoring integrated circuit (IC) 46. CP state change detector circuits 42 and 44 each receive the CP signal from EVSE 24. As explained in greater detail below, contact monitoring IC 46 monitors how first and/or second CP state change detector circuits 42 and 44 are driven by the CP signal to detect state changes of the CP signal.

First and second CP state change detector circuits 42 and 44 include a similar circuitry layout and have a same kind of electronic components as shown in FIG. 3. First and second CP state change detector circuits 42 and 44 differ in that switch S1 of first CP state change detector circuit is a PMOS device whereas corresponding switch S2 of second CP state change detector circuit is a NMOS device.

Figure 4:
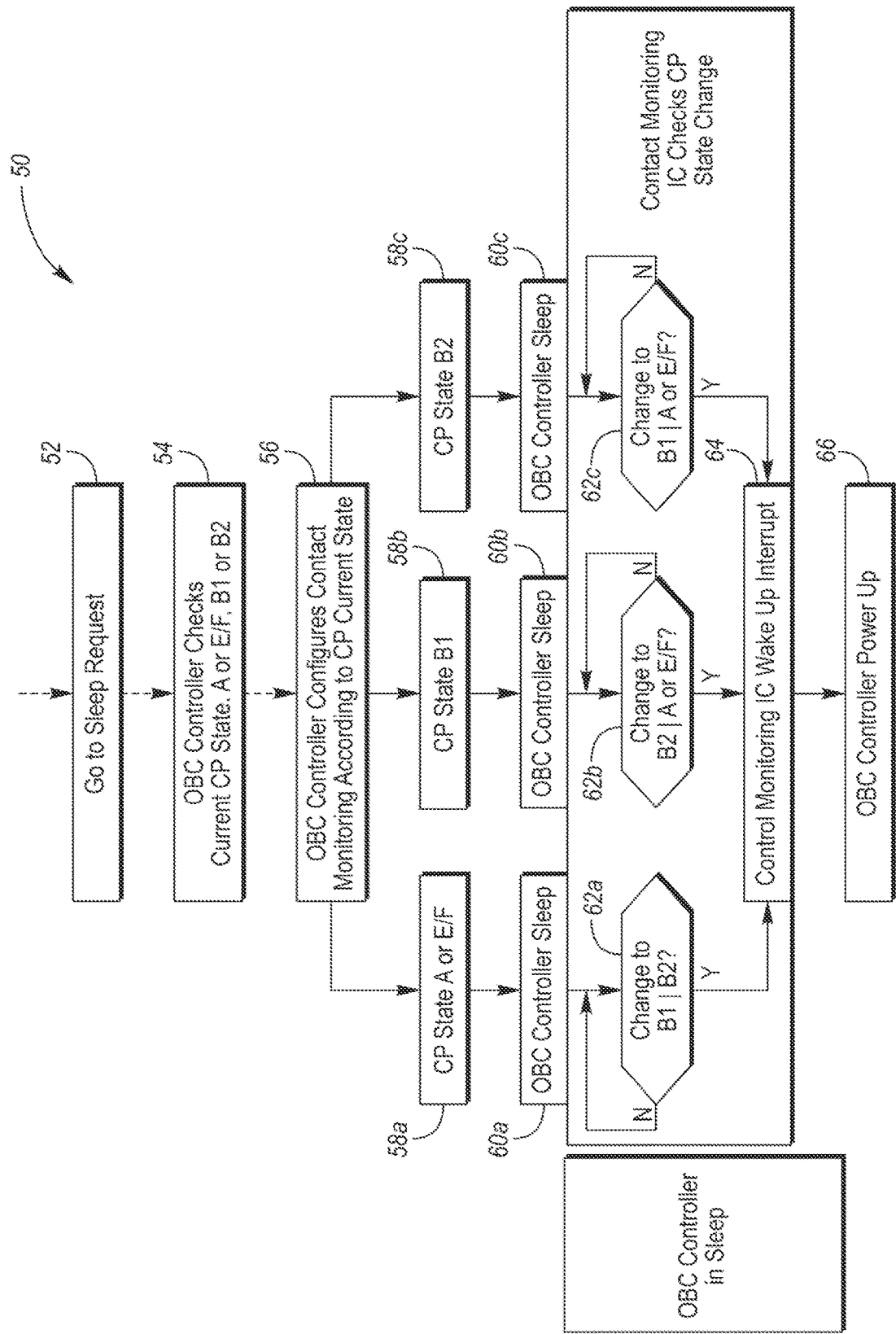
FIG. 4 illustrates a flowchart depicting representative operations for the OBC controller to enter the sleep mode and for the CP wake-up circuit to wake up the OBC controller in response to a state change of the CP signal.

Referring now to FIG. 4, with continual reference to FIGS. 1, 2, and 3, a flowchart 50 depicting representative operations for OBC controller 36 to enter the sleep mode and for CP wake-up circuit 38 to wake up the OBC controller in response to a state change of the CP signal is shown. The operations begin with OBC controller 36 receiving a request for OBC 18 to enter the sleep mode, as indicated in block 52. In response, OBC controller 36 checks the current state of the CP signal, as indicated in block 54. As described above, the current state of the CP signal may be state A or E/F, state B1, or state B2. OBC controller 36 then configures contact monitoring provided by contact monitoring IC 46 according to the current state of the CP signal, as indicated in block 56.

OBC controller 36 then goes to sleep. Particularly, in response to the sleep mode request at block 52, when the current state of the CP signal is state A or E/F, as indicated in block 58*a*, OBC controller 36 goes to sleep, as indicated in block 60*a*. Similarly, in response to the sleep mode request, when the current state of the CP signal is state B1, as indicated in block 58*b*, OBC controller 36 goes to sleep, as indicated in block 60*b*. Likewise, in response to the sleep mode request, when the current state of the CP signal is state B2, as indicated in block 58*c*, OBC controller 36 goes to sleep, as indicated in block 60*c*.

While OBC controller 36 is asleep, contact monitoring IC 46 checks for a state change of the CP signal. Contact monitoring IC 46 monitors first and/or second CP state change detector circuits 42 and 44, which are driven by the CP signal, to detect a change in the state of the CP signal. As such, when the state of the CP signal is state A or E/F, contact monitoring IC 46 detects whether the state of the CP signal has changed to either state B1 or state B2, as indicated in decision block 62*a*. Similarly, when the state of the CP signal is state B1, contact monitoring IC 46 detects whether the state of the CP signal has changed to either state B2 or state A or E/F, as indicated in decision block 62*b*. Likewise, when the state of the CP signal is state B2, contact monitoring IC 46 detects whether the state of the CP signal has changed to either state B1 or state A or E/F, as indicated in decision block 62*c*.

In each of the three decision blocks 62*a*, 62*b*, and 62*c*, if the state of the CP signal has not changed, then contact monitoring IC 46 rechecks for a change in the state of the CP signal. Contact monitoring IC 46 waits for a period of time before rechecking. This process is repeated until there is a change in the state of the CP signal. While the state of the CP signal remains unchanged, OBC controller 36 remains asleep.

Upon contact monitoring IC 46 detecting a change in the state of the CP signal in any of decision blocks 62*a*, 62*b*, and 62*c*, then the contact monitoring IC generates a wake-up signal, as indicated in block 64. Contact monitoring IC 46 provides the wake-up signal to OBC controller 36. In response to receiving the wake-up signal, OBC controller 36 powers up, as indicated in block 66. Once fully powered, OBC controller 36 exits the sleep mode and is awake. OBC 18 is thereby effectively awake. OBC controller 36 may then carry out functions such as controlling OBC power plant 34 and/or OBC relay 35 in accordance with the new state of the CP signal.

Figures 5, 6:
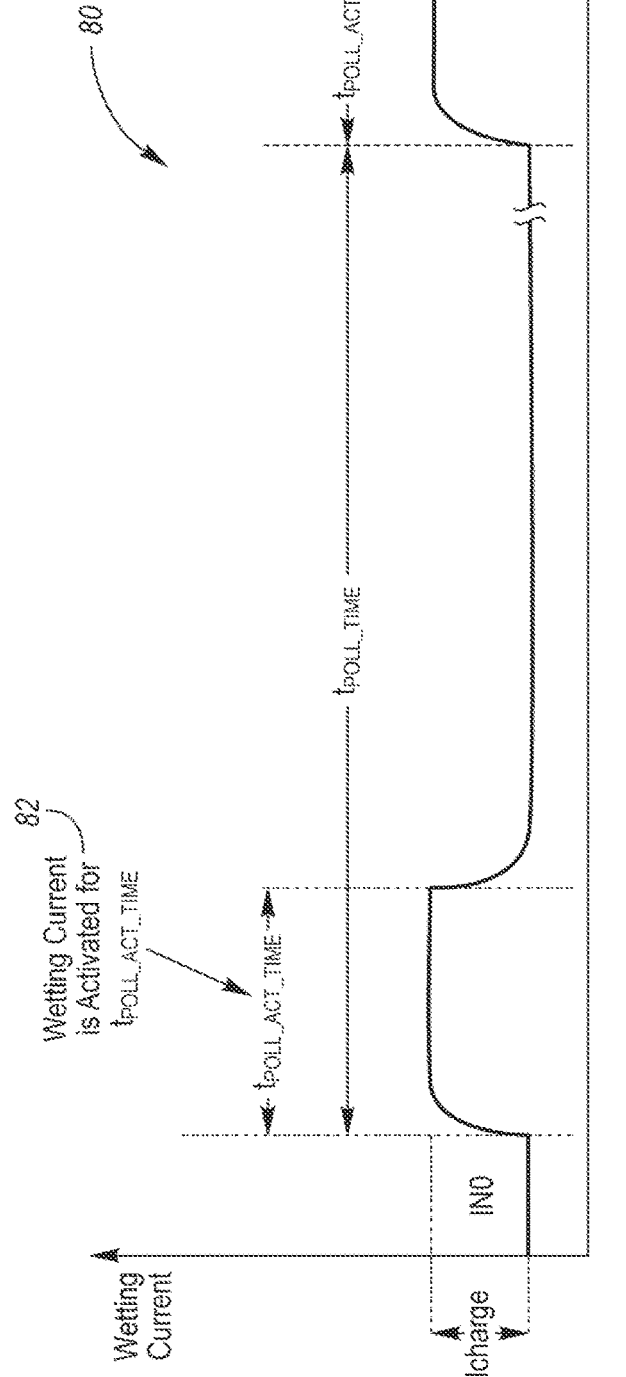
FIG. 5 illustrates a table depicting which CP state change detector circuit of the CP wake-up circuit is used for detecting a change in the state of the CP signal while the OBC controller is asleep and generating a wake-up signal for waking up the OBC controller.
FIG. 6 illustrates a timing diagram depictive of a polling sequence carried out by the contact monitoring IC of the CP wake-up circuit on the CP state change detector circuits of the CP wake-up circuit.

Referring now to FIG. 5, with continual reference to FIGS. 3 and 4, a table 70 is shown. Table 70 depicts which of first CP state change detector circuit 42 (i.e., Block 1) and/or second CP state change detector circuit 44 (i.e., Block 2) of CP wake-up circuit 38 is used for detecting a change in the state of the CP signal while OBC controller 36 is asleep and generating a wake-up signal for waking up the OBC controller.

As shown in table 70, when the state of the CP signal is state A or E/F while OBC controller 36 is asleep and changes to state B1, either of first or second CP state change detector circuits 42 or 44 is used to detect this state change and generate a wake-up signal for waking up the OBC controller. When the state of the CP signal is state A or E/F while OBC controller 36 is asleep and changes to state B2, second CP state change detector circuit 44 is used to detect this state change and generate a wake-up signal for waking up the OBC controller.

The CP signal has state A while cordset 20 is not connected to EV 12. The state of the CP signal changes from state A to state B1 upon cordset 20 being connected to EV 12 with EVSE 24 not being ready to charge. Thus, cordset 20 being connected to EV 12 with EVSE 24 not being ready to charge is detected using either of first or second detector circuits 42 or 44. The state of the CP signal changes from state A to state B2 upon cordset 20 being connected to EV 12 with EVSE 24 being ready to charge. Thus, cordset 20 being connected to EV 12 with EVSE 24 being ready to charge is detected using second detector circuit 44. Contact monitoring IC 46 generates a wake-up signal for waking up OBC controller 36 upon either detection. In this way, OBC controller 36 is woken up upon cordset 20 being connected to EV 12.

As further shown in table 70, when the state of the CP signal is state B1 while OBC controller 36 is asleep and changes to the state A or E/F, either of first or second CP state change detector circuits 42 or 44 is used to detect this state change and generate a wake-up signal for waking up the OBC controller. When the state of the CP signal is state B1 while OBC controller 36 is asleep and changes to the state B2, first CP state change detector circuit 42 is used to detect this state change and generate a wake-up signal for waking up the OBC controller.

The CP signal has state B1 while cordset 20 is connected to EV 12 with EVSE 24 not being ready to charge. The state of the CP signal changes from state B1 to state A upon cordset 20 being disconnected from EV 12 with EVSE 24 not being ready to charge. Thus, cordset 20 being disconnected from EV 12 with EVSE 24 not being ready to charge is detected using either of first or second detector circuits 42 or 44. Contact monitoring IC 46 generates a wake-up signal for waking up OBC controller 36 upon this detection. In this way, OBC controller 36 is woken up upon cordset 20 being disconnected from EV 12.

The state of the CP signal changes from state B1 to state B2 upon EVSE 24 becoming ready to charge while cordset 24 is connected to EV 12. Thus, EVSE 24 becoming ready to charge while cordset 20 is connected to EV 12 is detected using first detector circuit 42. Contact monitoring IC 46 generates a wake-up signal for waking up OBC controller 36 upon this detection. In this way, OBC controller 36 is woken up upon EVSE 24 becoming ready to charge while cordset 24 is connected to EV 12.

As further shown in table 70, when the state of the CP signal is state B2 while OBC controller 36 is asleep and changes to the state A or E/F, second CP state change detector circuit 44 is used to detect this state change and generate a wake-up signal for waking up the OBC controller. When the state of the CP signal is state B2 while OBC controller 36 is asleep and changes to the state B1, first CP state change detector circuit 42 is used to detect this state change and generate a wake-up signal for waking up the OBC controller.

The CP signal has state B2 while cordset 20 is connected to EV 12 with EVSE 24 being ready to charge. The state of the CP signal changes from state B2 to state A upon cordset 20 being disconnected from EV 12 with EVSE 24 being ready to charge. Thus, cordset 20 being disconnected from EV 12 with EVSE 24 being ready to charge is detected using second detector circuit 44. Contact monitoring IC 46 generates a wake-up signal for waking up OBC controller 36 upon this detection. In this way, OBC controller 36 is woken up upon cordset 20 being disconnected from EV 12.

The state of the CP signal changes from state B2 to state B1 upon EVSE 24 becoming not ready to charge while cordset 24 is connected to EV 12. Thus, EVSE 24 becoming not ready to charge while cordset 20 is connected to EV 12 is detected using first detector circuit 42. Contact monitoring IC 46 generates a wake-up signal for waking up OBC controller 36 upon this detection. In this way, OBC controller 36 is woken up upon EVSE 24 becoming not ready to charge while cordset 24 is connected to EV 12.

Referring now to FIG. 6, with continual reference to FIG. 3, a timing diagram 80 depictive of a polling sequence carried out by contact monitoring IC 46 on CP state change detector circuits 42 and 44 is shown. CP state change detector circuits 42 and 44 have a similar circuit layout, as shown in FIG. 3. Therefore, only the operation of the polling sequence on second CP state change detector circuit 44 (i.e., Block 2) will be described as follows.

As an example, assume that the state of the CP signal changes from the state B2 to the state A or E/F. While OBC controller 36 is in the sleep mode, the capacitors C2 and C2s of second CP state change detector circuit 44 are charged periodically through the IN0 port of contact monitoring IC 46. Contact monitoring IC 46 charges the capacitors C2 and C2s of second detector circuit 44 with a frequency rate of $1/t_{POLL\_TIME}$. The frequency rate ($1/t_{POLL\_TIME}$) is much lower than the frequency (fCP) of the CP signal. As such, as indicated by reference arrow 82 in timing diagram 80 of FIG. 6, mainly capacitor C2 of second detector circuit 44 is charged with a relatively small injected current ($I_{CHARGE}$) during a relatively short period of time ($t_{POLL\_ACT\_TIME}$). In this regard, an example of the configuration of contact monitoring IC 46 is $I_{CHARGE}$=5 mA, $t_{POLL\_TIME}$=64 ms (Control Pilot period=1 ms), and $t_{POLL\_ACT\_TIME}$=128 μs.

The voltage of the capacitor C2 of second detector circuit 44 ramps up relatively fast while the capacitor C2s of the second detector circuit gets progressively charged while there are no pulses until the capacitor C2s has the same voltage as the capacitor C2. While the CP signal remains in the state B2, during which the CP signal has a duty cycle (D) of 5%≤D≤95% and a supply voltage Vg=±12V, when a control pilot positive pulse comes in the capacitor C2 discharges through the resistor R2 of second detector circuit and, in consequence, the capacitor C2s discharges through the resistors R2 and R2s of second detector circuit 44.

However, upon the state of the CP signal changing from the state B2 to the state A or E/F, the voltage of capacitor C2s increases and eventually reaches a pre-programmed threshold voltage. A wake-up signal output (WUP output) of contact monitoring IC 46 is triggered upon the voltage of capacitor C2s becoming greater than the threshold voltage. Contact monitoring IC 46 in response provides a wake-up signal to OBC controller 36 to wake up the OBC controller.

Figure 7:
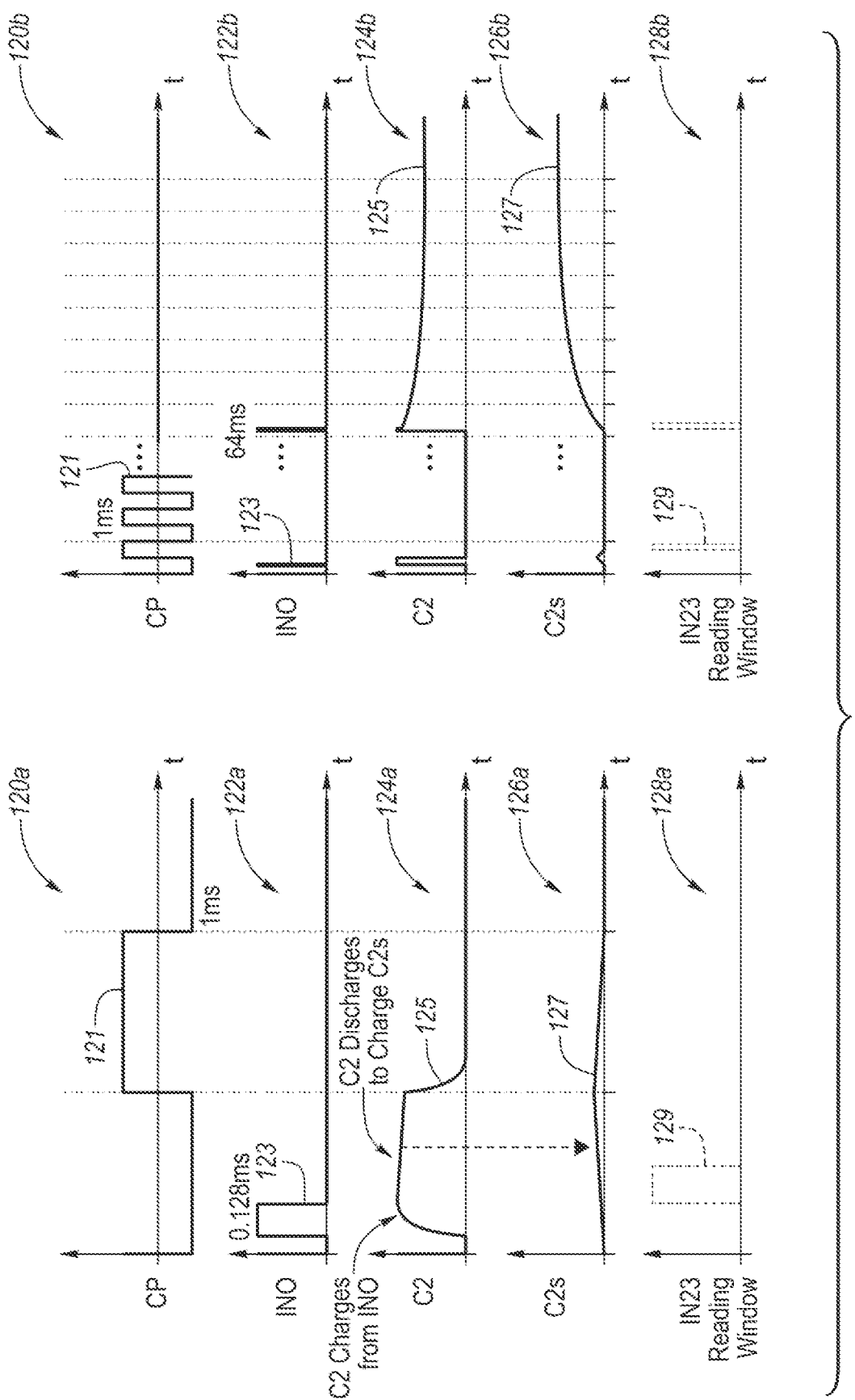
FIGS. 7 and 8 each illustrates graphs corresponding to the charging process of first (C2) and second (C2s) capacitors of the second CP state change detector circuit during the polling sequence operation carried out by the contact monitoring IC.
Figure 8:
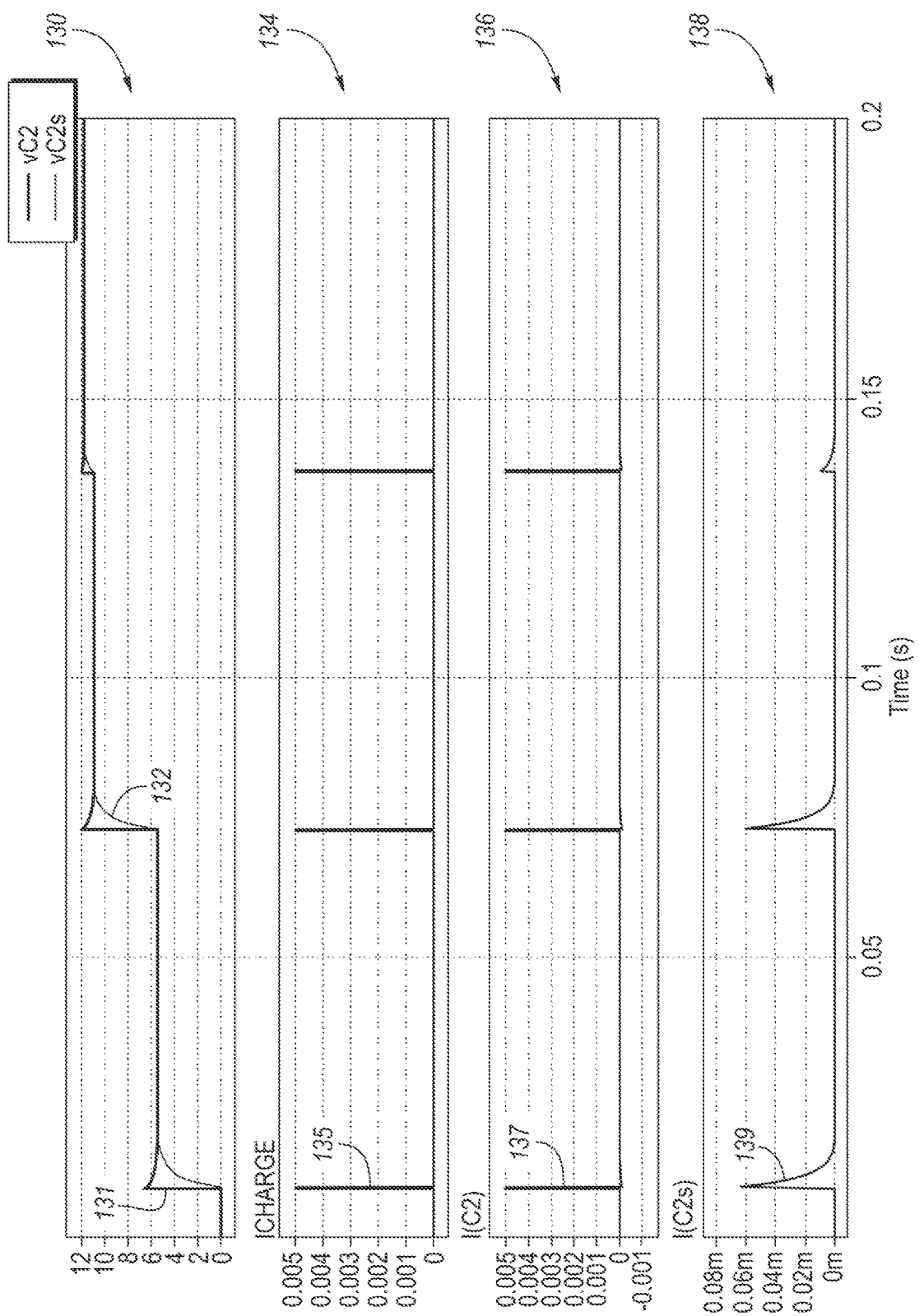

Referring now to FIGS. 7 and 8, with continual reference to FIGS. 3 and 6, the charging process of capacitors C2 and C2s during the polling sequence operation carried out by contact monitoring IC 46 will be described in further detail.

FIG. 7 illustrates graphs corresponding to the charging process of capacitors C2 and C2s during the polling sequence operation. Particularly, FIG. 7 includes: a first graph 120a of a plot 121 of the CP signal versus time and a corresponding graph 120b depicting a longer time duration version of first graph 120a; a second graph 122a of a plot 123 of the timing/duration of the injected current charging provided from the IN0 port of contact monitoring IC 46 and a corresponding graph 122b depicting a longer time duration version of second graph 122a; a third graph 124a of a plot 125 of the charge level of capacitor C2 versus time and a corresponding graph 124b depicting a longer time duration version of third graph 124a; a fourth graph 126a of a plot 127 of the charge level of capacitor C2s versus time and a corresponding graph 126b depicting a longer time duration version of fourth graph 126a; and a fifth graph 128a of a plot 129 of the timing/duration of measuring the charge level of capacitor C2s conducted from the IN23 port of contact monitoring IC 46 and a corresponding graph 128b depicting a longer time duration version of fifth graph 128a.

FIG. 8 illustrates additional graphs corresponding to the charging process of capacitors C2 and C2s during the polling sequence operation. Particularly, FIG. 8 includes: a first graph 130 of a plot 131 of the charge level of capacitor C2 versus time and a plot 132 of the charge level of capacitor C2s versus time; a second graph 134 of a plot 135 of the periodically injected current ($I_{CHARGE}$) versus time; a third graph 136 of a plot 137 of the current of capacitor C2 versus time; and a fourth graph 138 of a plot 139 of the current of capacitor C2s versus time.

With reference to the graphs of FIGS. 7 and 8, with successive IN0 pulses, capacitor C2 charges and then transfers voltage to capacitor C2s (up to same voltage level), until capacitor C2s (at IN23 evaluation window) is higher (in this state-change example) than the defined threshold.

As described, while OBC controller 36 is in the sleep mode, the capacitors C2 and C2s of second CP state change detector circuit 44 are charged periodically through the IN0 port of contact monitoring IC 46. Contact monitoring IC 46 fully charges capacitor C2 while capacitor C2s is nearly unaffected (the resistor R2s+capacitance combination of capacitor C2s makes capacitor C2s much slower to charge). Contact monitoring IC 46 outputs current ($I_{CHARGE}$) most of which goes through capacitor C2 and makes the voltage of capacitor C2 increase. The resistor R2s between capacitors C2 and C2s practically blocks current ($I_{CHARGE}$) from directly going to capacitor C2s. Once the current injection of contact monitoring IC 46 is finished, then capacitor C2 progressively delivers energy to capacitor C2s until both capacitors are equally charged (i.e., have the same voltage). This sequence is given as long as transistor S2 is kept open.

The use of capacitor C2s is to get a stable indication of status change. First capacitor C2 may be more affected with noise, but also the charging of capacitor C2 and reading of IN23 port may be done before the CP signal changes, while capacitor C2 is still fully charged (see the graphs of FIGS. 7 and 8). In sum, capacitor C2 is responsible for "getting" energy from contact monitoring and the other capacitor C2s is responsible for charging "slowly enough" to be discharged by CP signal oscillation.

Figure 9:
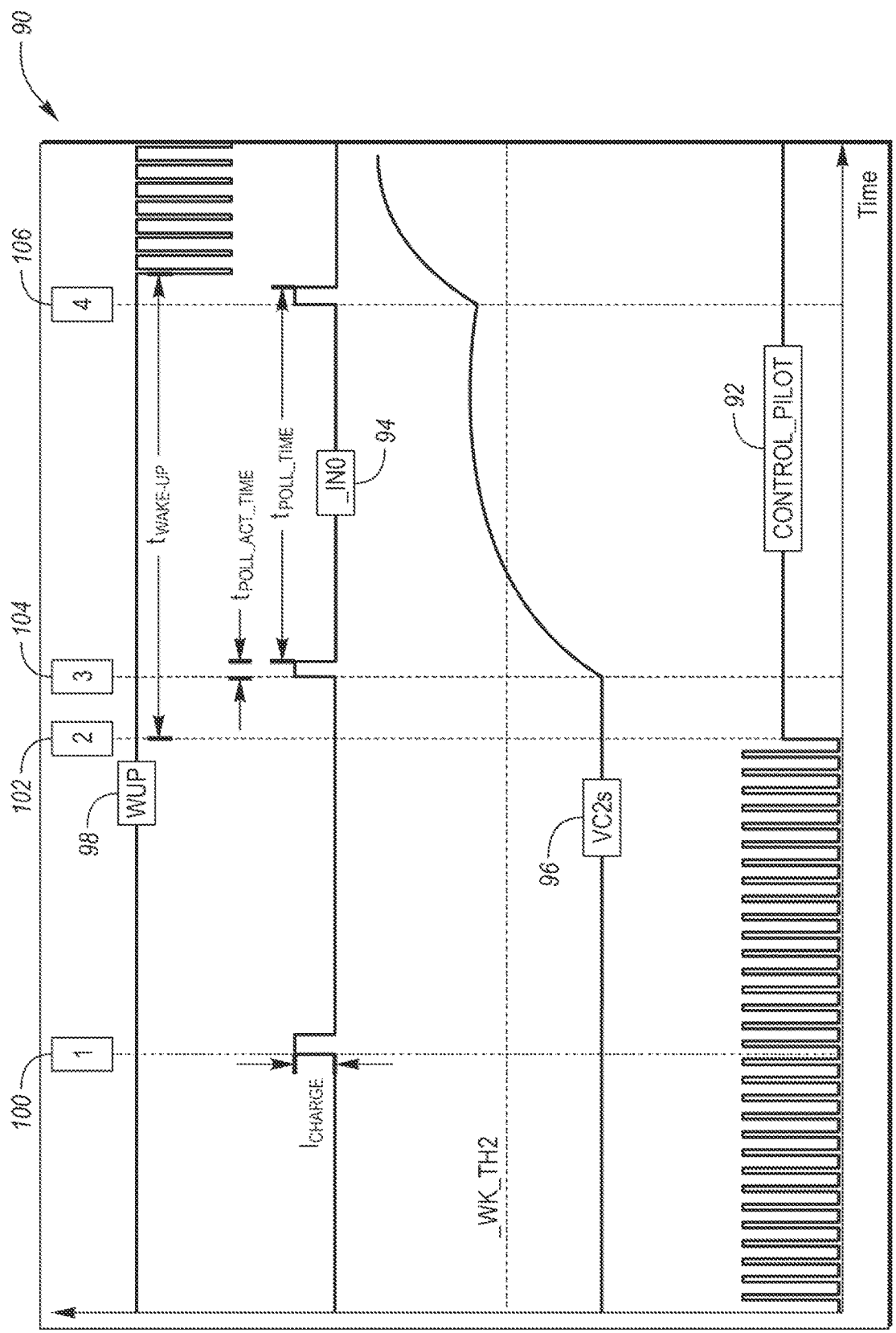
FIG. 9 illustrates a measurement output while the OBC controller is asleep and then awaken in response to a change in the state of the CP signal, the measurement output having a plot of the voltage of the CP signal, a plot of current injected from the contact monitoring IC to first and second capacitors of a selected one of the CP state change detector circuits, a plot of the voltage of the second capacitor of the selected CP state change detector circuit, and a plot of the voltage of a wake-up signal.

Referring now to FIG. 9, with continual reference to FIGS. 3 and 6, a measurement output 90 is shown. Measurement output 90 is taken while OBC controller 36 is asleep and is then awaken in response to a change in the state of the CP signal. Measurement output 90 has a plot 92 of the voltage of the CP signal, a plot 94 of the current injected from contact monitoring IC 46 to capacitors C2 and C2s of second detector circuit 44, a plot 96 of the voltage of capacitor C2s of the second detector circuit, and a plot 98 of the voltage of wake-up signal. Overlaid in measurement output 90 is a first timing event flag ("1") 100, a second timing event flag ("2") 102, a third timing event flag ("3") 104, and a fourth timing event flag ("4") 106.

Measurement output 90 is indicative of chronological events that lead to CP wake-up circuit 38 waking up OBC controller 36. From the moment that OBC controller 36 enters the sleep mode until the OBC controller awakens in response to a wake-up request from CP wake-up circuit 38, the polling sequence shown in FIG. 6 periodically occurs. As described, the polling sequence involves contact monitoring IC 46 injecting a current pulse to the capacitors CS and C2s of second detector circuit 44 followed by an evaluation of the voltage of the capacitor C2s.

In the example of measurement output 90, the preconditions include OBC controller 36 being in the sleep mode with cordset 20 connecting OBC 18 to EVSE 24 and the CP signal having the state B2. Up to the second timing event flag 102, the CP signal, as defined per state B2, is switching with Vg=±12 V and (5%≤D≤95%), as shown in plot 92.

Contact monitoring IC 46 injects current ($I_{CHARGE}$) from its port IN0 to capacitors C2 and C2s of second detector circuit 44 during the $t_{POLL\_ACT\_TIME}$ (128 μs) of each $t_{POLL-}$ _TIME (64 ms). The first, third, and fourth timing event flags 100, 104, and 106 correspond to contact monitoring IC 46 initiating current injection to capacitors C2 and C2s. The current injected from contact monitoring IC 46 to capacitors C2 and C2s is represented by plot 94. The injected current charges capacitors C2 and C2s. The voltage of capacitor C2s is represented by plot 96. The voltage of port IN23 of contact monitoring IC 46 is evaluated in a short time after the current injection ending. The voltage of port IN23 of contact monitoring IC 46 is the voltage of capacitor C2s.

During the first timing event 100 the state of the CP signal remains in state B2. Consequently, due to the presence of PWM in the CP signal (i.e., due to the CP signal switching with Vg=±12 V and 5%≤D≤95%), the voltage of capacitor C2s does not reach a pre-programmed wake-up voltage threshold while IN23 is being evaluated. The wake-up voltage threshold is labeled "WK_TH2" on measurement output 90. For example, in this scenario, the wake-up voltage threshold is 3.8 V.

At the second timing event 102, the state of the CP signal changes from state B2 to state A. The CP signal, as defined by state A, is 0V, as shown in plot 92 of the CP signal following second timing event flag 102.

Second timing event 102 occurs during the $f_{POLL\_TIME}$ (64 ms) following contact monitoring IC 46 initiating current injection at first timing event 100. Upon the expiration of the $t_{POLL\_TIME}$ (64 ms) following first timing event 100 (i.e., upon completion of a polling sequence), contact monitoring IC 46 initiates at third timing event 104 another round of current injection to capacitors C2 and C2s (i.e., a new polling sequence is initiated). The voltage of port IN23 of contact monitoring IC 46 is evaluated in a short time after the current injection ending during the third timing event 104. In this case, due to the change in the state of the CP signal, the capacitors C2 and C2s are not discharged so their voltages increase. At this point the energy provided to capacitor C2s is not enough to cross the wake-up voltage threshold. Capacitor C2s is slowly charged and its voltage at fourth timing event 106 becomes already greater than the voltage threshold WK_TH2.

At the fourth timing event 106 contact monitoring IC 46 initiates another round of current injection to capacitors C2 and C2s (i.e., another polling sequence is initiated). The voltage of capacitor C2s has already increased greater than the wake-up voltage threshold. The voltage of port IN23 of contact monitoring IC 46, which is the voltage of the capacitor C2s, is evaluated in a short time after the current injection ending during the fourth timing event 106. In response to contact monitoring IC 46 detecting the voltage of the capacitor C2s becoming greater than the wake-up voltage threshold, the contact monitoring IC generates a wake-up signal and provides same to OBC controller 36 to wake up the OBC controller.

The functioning of second state change detector circuit 44 (i.e., Block 2) has thus been described. Conceptually, first state change detector circuit 42 (i.e., Block 1) functions the same way as second detector circuit 44. Second detector circuit 44 is configured to detect for state changes of the CP signal from (i) either state B1 or state B2 to (ii) state A whereas first detector circuit 42 is configured to detect for state changes of the CP signal from (i) either state A or state B2 to (ii) state B 1.

The following tables further explain the operational details of first state change detector circuit 42 (i.e., Block 1) and second state change detector circuit 44:

The effect of each CP-state to Block 1 and Block 2 circuits is described in this Table:

|  | CP | Block 1 | | Block 2 | |
| --- | --- | --- | --- | --- | --- |
|  |  | S1 (PMOS) | C1 & C1s | S2 (NMOS) | C2 & C2s |
| State A | Duty 0% (0 V) | Conducting (switch ON) | Practically discharged | Non-Conducting (switch OFF) | Fully charged |
| State B1 | Duty 100% (~12 V) | Non-Conducting (switch OFF) | Fully charged | Conducting (switch ON) | Practically discharged |
| State B2 | Duty [5, 95]% (oscillating) | Periodically switching | Practically discharged | Periodically switching | Practically discharged |

The change in the voltage of capacitor C2s at each CP-state change (and how the threshold is "trespassed") is described in this Table:

| What block has to be used? | | CP state change to (generating Wake-up) | | |
| --- | --- | --- | --- | --- |
|  |  | A or E/F | B1 | B2 |
| CP State when going to sleep | A or E/F | | Block 1 ($V_{C1s}$ > Threshold$_1$) Block 2 ($V_{C2s}$ < Threshold$_2$) | Block 2 ($V_{C2s}$ < Threshold$_2$) |
|  | B1 | Block 1 ($V_{C1s}$ < Threshold$_1$) Block 2 ($V_{C2s}$ > Threshold$_2$) | | Block 1 ($V_{C1s}$ < Threshold$_1$) |
|  | B2 | Block 2 ($V_{C2s}$ > Threshold$_2$) | Block 1 ($V_{C1s}$ > Threshold$_1$) | |

Contact monitoring IC 46 can be programmed to adjust $I_{CHARGE}$, $t_{POLL\_TIME}$, and $t_{POLL\_ACT\_TIME}$ and multiple voltage thresholds according to the wake-up needs depending on the status of the CP signal. OBC controller 38 can carry out such programming of contact monitoring IC 46 and may do so prior to the OBC controller falling asleep. As such, the use of contact monitoring IC 46 allows meeting OEM requirements pertaining to wake-up capabilities, wake-up time, and quiescent current.

Wake-up time and quiescent current requirements are becoming more stringent. The evolution of charging stations for EVs requires the addition of new wake-up reasons in electrification products. To this end, first-in-class wake-up requirements include wake up under any state change of the CP signal, wake-up time lower than 200 ms, and quiescent current lower than 200 µA. As described herein, CP wake-up circuit 38 provides a simple and cost-effective solution to meet the first-in-class wake-up requirements by means of a state change detector current-sourced circuit. Particularly, as described herein, CP wake-up circuit 38 includes first and second CP state change detector circuits 42 and 44 composed of a minimum number of electronic components and contact monitoring IC 46 that is common to the detector circuits to provide the expected wake-up while keeping consumption low.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. An on-board charger for an electric vehicle, comprising:
   a charge unit operable for receiving energy from an EVSE for charging a traction battery of the electric vehicle;
   a controller operable to be in a sleep mode or in an awake mode, the controller in the awake mode configured to control the charge unit to charge the traction battery with energy from the EVSE; and
   a control pilot wake-up circuit configured to receive a control pilot signal from the EVSE, detect for a change in a current state of the control pilot signal while the controller is in the sleep mode, and generate a wake-up signal for waking up the controller in response to the current state of the control pilot signal changing to a new state;
   wherein the control pilot wake-up circuit includes:
      a first control pilot state change detector circuit usable for detecting for a change in the current state of the control pilot signal to a first new state,
      a second control pilot state change detector circuit usable for detecting for a change in the current state of the control pilot signal to a second new state, and
      a contact monitoring circuit common to the first and second control pilot state change detector circuits,
      wherein the first and second control pilot state change detector circuits have a same kind of electronic components,
      the electronic components of the first control pilot state change detector circuit include a first capacitor,
      the contact monitoring circuit is operable to periodically inject a current pulse to the first capacitor for charging the first capacitor, wherein the electronic components of the first control pilot state change detector circuit are arranged such that the first capacitor discharges after receiving the current pulse while the current state of the control pilot signal remains unchanged and charges to have a voltage greater than a threshold upon receiving one or more of the current pulses after the current state of the control pilot signal has changed from the current state to the first new state, and
      the contact monitoring circuit is further operable to generate the wake-up signal for waking up the controller in response to the voltage of the first capacitor becoming greater than the threshold due to the current state of the control pilot signal changing to the first new state.

2. The on-board charger of claim 1 wherein:
   the charge unit includes at least one of (i) a power plant operable for converting energy received from the EVSE into a usable form for charging the traction battery and (ii) a relay operable for transferring energy received from the EVSE directly to the traction battery.

3. The on-board charger of claim 1 wherein:
   the electronic components of the second control pilot state change detector circuit include a second capacitor;
   the contact monitoring circuit is operable to periodically inject a current pulse to the second capacitor for charging the second capacitor, wherein the electronic components of the second control pilot state change detector circuit are arranged such that the second capacitor discharges after receiving the current pulse while the current state of the control pilot signal remains unchanged and charges to have a voltage greater than the threshold upon receiving one or more of the current pulses after the current state of the control pilot signal has changed from the current state to the second new state; and
   the contact monitoring circuit is further operable to generate the wake-up signal for waking up the controller in response to the voltage of the second capacitor becoming greater than the threshold due to the current state of the control pilot signal changing to the second new state.

4. The on-board charger of claim 1 wherein:
   the first control pilot state change detector circuit and the second control pilot state change detector circuit are both usable for detecting for a change in the current state of the control pilot signal to a third new state.

5. An on-board charger for an electric vehicle, comprising:
   a charge unit operable for receiving energy from an EVSE for charging a traction battery of the electric vehicle;
   a controller operable to be in a sleep mode or in an awake mode, the controller in the awake mode configured to control the charge unit to charge the traction battery with energy from the EVSE; and
   a control pilot wake-up circuit configured to receive a control pilot signal from the EVSE, detect for a change in a current state of the control pilot signal while the controller is in the sleep mode, and generate a wake-up signal for waking up the controller in response to the current state of the control pilot signal changing to a new state;
   wherein states of the control pilot signal include a state A in which a voltage of the control pilot signal is zero volts, a state B1 in which the voltage of the control pilot signal is a constant, positive, non-zero value of volts, and a state B2 in which the voltage of the control pilot signal is an alternating, non-zero value of volts, wherein:
      the control pilot wake-up circuit includes a first control pilot state change detector circuit and a second control pilot state change detector circuit usable, wherein the first and second control pilot state change detector circuits have a same kind of electronic components;

wherein when the current state of the control pilot signal is either the state B1 or the state B2, the first control pilot state change detector circuit is used for detecting for a change in state of the control pilot signal from either the state B1 to the state B2 or the state B2 to the state B 1; and wherein when the current state of the control pilot signal is either the state A or the state B2, the second control pilot state change detector circuit is used for detecting for a change in state of the control pilot signal from either the state A to the state B2 or the state B2 to the state A.

6. The on-board charger of claim 5 wherein:
when the current state of the control pilot signal is either the state A or the state B1, either of the first control pilot state change detector circuit or the second control pilot state change detector circuit is used for detecting for a change in state of the control pilot signal from either the state A to the state B1 or the state B1 to the state A.

7. An on-board charger for an electric vehicle, comprising:
a charge unit operable for receiving energy from an EVSE for charging a traction battery of the electric vehicle;
a controller operable to be in a sleep mode or in an awake mode, the controller in the awake mode configured to control the charge unit to charge the traction battery with energy from the EVSE; and
a control pilot wake-up circuit configured to receive a control pilot signal from the EVSE, detect for a change in a current state of the control pilot signal while the controller is in the sleep mode, and generate a wake-up signal for waking up the controller in response to the current state of the control pilot signal changing to a new state;
wherein states of the control pilot signal include a state A indicative of a cordset of the EVSE being disconnected from the on-board charger, a state B1 indicative of the cordset of the EVSE being connected to the on-board charger but the EVSE not being ready to charge, and a state B2 indicative of the cordset of the EVSE being connected to the on-board charger and the EVSE being ready to charge, wherein:
the control pilot wake-up circuit includes a first control pilot state change detector circuit and a second control pilot state change detector circuit usable, wherein the first and second control pilot state change detector circuits have a same kind of electronic components; and wherein when the current state of the control pilot signal is the state A, the second control pilot state change detector circuit is used for detecting for a change in state of the control pilot signal from the state A to the state B2 whereby the controller is woken up upon the cordset of the EVSE being connected to the on-board charger with the EVSE being ready to charge.

8. The on-board charger of claim 7 wherein when the current state of the control pilot signal is the state A, either of the first control pilot state change detector circuit or the second control pilot state change detector circuit is used for detecting for a change in state of the control pilot signal from the state A to the state B1 whereby the controller is woken up upon the cordset of the EVSE being connected to the on-board charger with the EVSE not being ready to charge.

9. The on-board charger of claim 7 wherein when the current state of the control pilot signal is the state B 1, the first control pilot state change detector circuit is used for detecting for a change in state of the control pilot signal from the state B1 to the state B2 whereby the controller is woken up while the cordset of the EVSE is connected to the on-board charger upon the EVSE being ready to charge.

10. The on-board charger of claim 7 wherein when the current state of the control pilot signal is the state B2, the first control pilot state change detector circuit is used for detecting for a change in state of the control pilot signal from the state B2 to the state B1 whereby the controller is woken up while the cordset of the EVSE is connected to the on-board charger upon the EVSE not being ready to charge.

11. The on-board charger of claim 7 wherein when the current state of the control pilot signal is the state B2, the second control pilot state change detector circuit is used for detecting for a change in state of the control pilot signal from the state B2 to the state A whereby the controller is woken up upon the cordset of the EVSE being disconnected from the on-board charger.

12. The on-board charger of claim 7 wherein when the current state of the control pilot signal is the state B1, either of the first control pilot state change detector circuit or the second control pilot state change detector circuit is used for detecting for a change in state of the control pilot signal from the state B1 to the state A whereby the controller is woken up upon the cordset of the EVSE being disconnected from the on-board charger.

* * * * *